(12) United States Patent
Kim (10) Patent No.: US 10,103,177 B2
(45) Date of Patent: Oct. 16, 2018

(54) THIN FILM TRANSISTOR ARRAY PANEL AND MANUFACTURING METHOD OF THE SAME

(71) Applicant: Samsung Display Co., Ltd., Yongin-si (KR)

(72) Inventor: Duk-Sung Kim, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/454,344

(22) Filed: Mar. 9, 2017

(65) Prior Publication Data

US 2017/0287945 A1    Oct. 5, 2017

(30) Foreign Application Priority Data

Mar. 29, 2016    (KR) .......................... 10-2016-0037930

(51) Int. Cl.
  *H01L 27/12*   (2006.01)
  *H01L 27/32*   (2006.01)
  *G02F 1/1368*  (2006.01)

(52) U.S. Cl.
  CPC ........ *H01L 27/1225* (2013.01); *H01L 27/124* (2013.01); *H01L 27/1248* (2013.01); *H01L 27/1288* (2013.01); *H01L 27/322* (2013.01); *H01L 27/3258* (2013.01); *H01L 27/3272* (2013.01); *H01L 27/3276* (2013.01); *G02F 1/1368* (2013.01); *H01L 2227/323* (2013.01)

(58) Field of Classification Search
  CPC . H01L 27/1225; H01L 27/322; H01L 27/124; H01L 27/1248; H01L 27/3258; H01L 27/3272; H01L 27/3276; H01L 27/1288; H01L 2227/323; G02F 1/1368
  See application file for complete search history.

(56) References Cited

U.S. PATENT DOCUMENTS

| 2007/0103610 | A1  | 5/2007  | Lee et al. |
| 2010/0051956 | A1  | 3/2010  | You |
| 2010/0140610 | A1* | 6/2010  | Lee ..................... H01L 27/1225 257/43 |
| 2010/0301327 | A1  | 12/2010 | Kang et al. |
| 2014/0097006 | A1* | 4/2014  | Park ..................... H01L 29/458 174/257 |

FOREIGN PATENT DOCUMENTS

| KR | 10-2007-0036979 | 7/2007 |
| KR | 10-2010-0028367 | 3/2010 |
| KR | 10-1151799      | 6/2012 |
| KR | 10-1287478      | 7/2013 |

* cited by examiner

*Primary Examiner* — Kyoung Lee
(74) *Attorney, Agent, or Firm* — H.C. Park & Associates, PLC (57) ABSTRACT

A thin film transistor array panel includes a substrate, a data line and a light blocking layer disposed on the substrate, a thin film transistor disposed on the light blocking layer and including a source electrode, a drain electrode, and an oxide semiconductor layer, and an insulating layer disposed on the substrate and including a first contact hole overlapping a portion of the data line, a second contact hole overlapping a portion of the source electrode, and a third contact hole overlapping a portion of the drain electrode, wherein the first contact hole, the second contact hole, and the third contact hole are arranged in a row in a first direction perpendicular to a direction in which the data line is extended.

18 Claims, 11 Drawing Sheets

FIG. 14 ary panel and a manufacturing method of the same.
Discussion of the Background

THIN FILM TRANSISTOR ARRAY PANEL AND MANUFACTURING METHOD OF THE SAME

CROSS-REFERENCE TO RELATED APPLICATION

This application claims priority from and the benefit of Korean Patent Application No. 10-2016-0037930, filed on Mar. 29, 2016, which is hereby incorporated by reference for all purposes as if fully set forth herein.

BACKGROUND

Field

Exemplary embodiments relate to a thin film transistor array panel and a manufacturing method of the same.

Discussion of the Background

A thin film transistor (TFT) is used in various electronic devices such as a display device. For example, the thin film transistor is used as a switching element or a driving element in a display device such as a liquid crystal display (LCD) and an organic light emitting diode (OLED) display.

The thin film transistor includes a gate electrode, a source electrode, a drain electrode facing the source electrode, and a semiconductor electrically connected to the source electrode and the drain electrode. The semiconductor is an important factor in determining characteristics of the transistor.

Conventional thin film transistors use silicon (Si) as the semiconductor. The silicon is either amorphous silicon or polycrystalline silicon. Amorphous silicon has a simple manufacturing process but has low charge mobility such that there is a limit for manufacturing a high performance thin film transistor. On the other hand, polycrystalline silicon has high charge mobility but requires an additional crystallizing step that significantly increases the manufacturing cost and complexity of creating the polycrystalline silicon as a suitable semiconductor. Thus, conventional thin film transistors have either low charge mobility or have prohibitively high manufacturing cost and complexity.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments provide a thin film transistor array panel and method of manufacturing the same using an oxide semiconductor enabling higher on/off ratios and higher carrier mobility than amorphous silicon. In addition, exemplary embodiments using the oxide semiconductor have lower cost, lower complexity, and higher uniformity than polycrystalline silicon.

Moreover, exemplary embodiments provide a thin film transistor array panel having an improved aperture ratio and transmittance, and a manufacturing method of the thin film transistor array panel that simplifies the process and prevents damage to the organic layer.

Additional aspects will be set forth in the detailed description which follows, and, in part, will be apparent from the disclosure, or may be learned by practice of the inventive concepts.

According to exemplary embodiments, a thin film transistor array panel includes: a substrate; a data line and a light blocking layer disposed on the substrate; a thin film transistor disposed on the light blocking layer and including a source electrode, a drain electrode, and an oxide semiconductor layer; and an insulating layer disposed on the substrate and including a first contact hole overlapping a portion of the data line, a second contact hole overlapping a portion of the source electrode, and a third contact hole overlapping a portion of the drain electrode, wherein the first contact hole, the second contact hole, and the third contact hole are arranged in a row in a first direction perpendicular to a direction in which the data line is extended.

According to exemplary embodiments, a method for manufacturing a thin film transistor array panel includes: forming a data line on a substrate; forming a source electrode, a drain electrode, and an oxide semiconductor layer on the substrate; applying an insulating layer and a metallic material layer on the source electrode, the drain electrode, and the oxide semiconductor layer; forming a first photoresist pattern on the metallic material layer, the first photoresist pattern including a first portion having a first height and a second portion having a second height lower than the first height; etching the insulating layer and the metallic material layer by using the first photoresist pattern to form a first contact hole overlapping a portion of the data line, a second contact hole overlapping a portion of the source electrode, and a third contact hole overlapping a portion of the drain electrode in the insulating layer; removing the first portion of the first photoresist pattern and part of the second portion of the photoresist pattern to form a second photoresist pattern; and etching the metallic material layer by using the second photoresist pattern as an etching mask.

According to a thin film transistor array panel and a manufacturing method of the same according to an exemplary embodiments, an aperture ratio and transmittance can be improved, and the manufacturing method of the thin film transistor array panel can reduce the number of masks, thereby reducing the manufacturing cost and preventing the organic layer from being damaged during the manufacturing process.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, a thin film transistor array panel and a method of manufacturing the same according to an exemplary embodiment will be described in detail with reference to the accompanying drawings.

Figure 1:
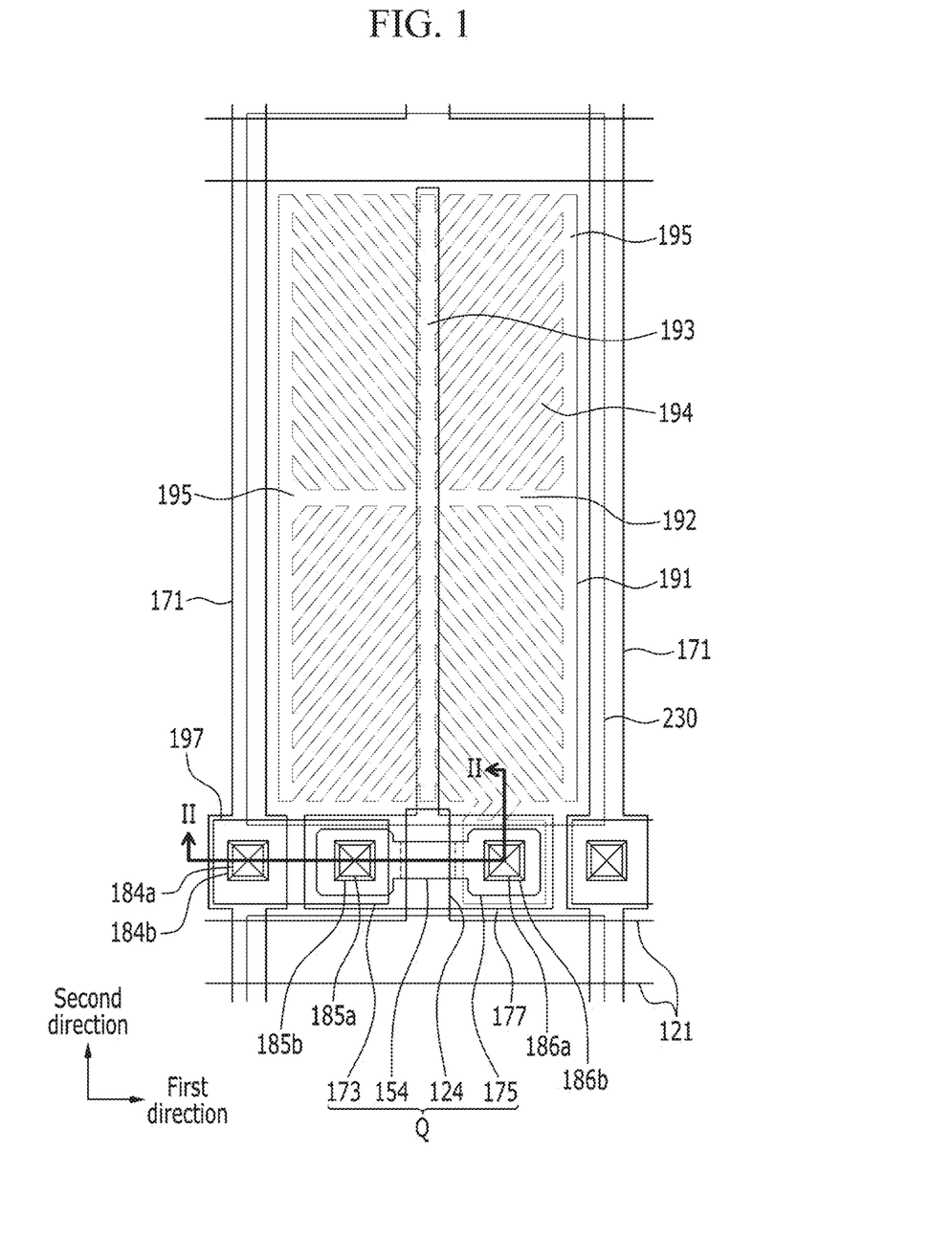
FIG. 1 is a top plan view of a pixel according to an exemplary embodiment.
Figure 2:
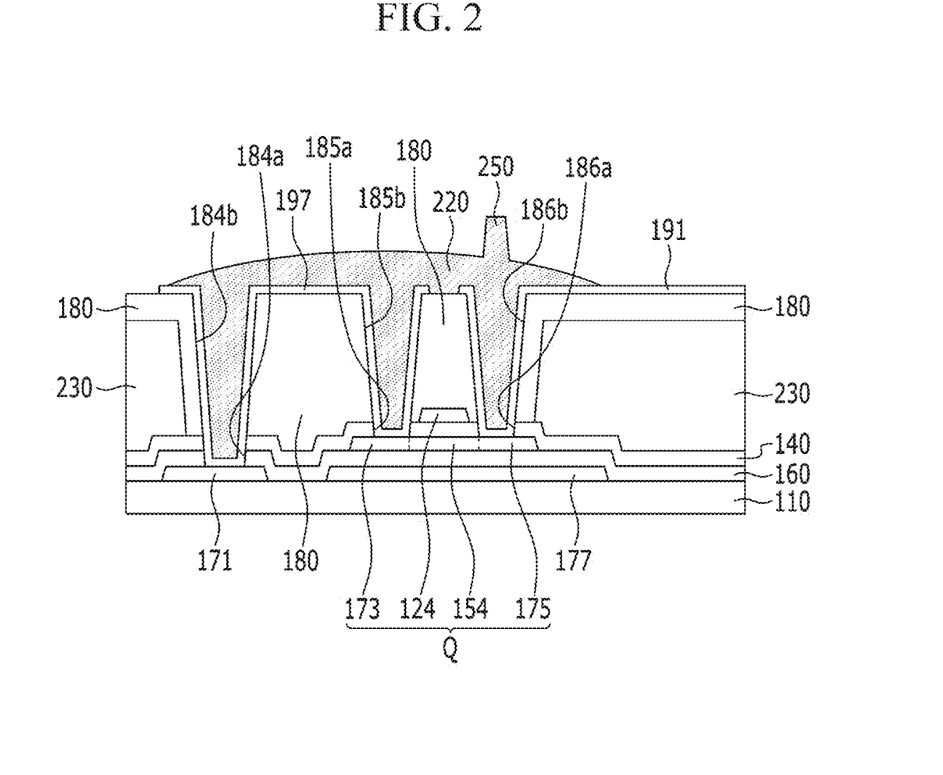
FIG. 2 is a cross-sectional view taken along line II-II' of FIG. 1.

A thin film transistor array panel according to an exemplary embodiment will be described with respect to FIG. 1 and FIG. 2. FIG. 1 is a top plan view of a pixel of an exemplary embodiment. FIG. 2 is a cross-sectional view taken along line II-II' of FIG. 1.

Referring to FIG. 1 and FIG. 2, a data line 171 and a light blocking layer 177 are disposed on a substrate 110 including a transparent material such as glass or plastic.

The data line 171 transmits a data signal, and may extend in a second direction of FIG. 1. The data line 171 may be a single layer or a multilayer, and may include a conductive material such as molybdenum, chromium, tantalum, titanium, copper, or an alloy thereof.

In an exemplary embodiment, the data line 171 has a multilayer structure, and the uppermost layer of the data line, in contact with the insulating layer, may be formed with a transparent conductive material. The transparent conductive material may be indium tin oxide or indium zinc oxide.

For example, the data line 171 may have a triple layer structure of titanium/copper/transparent conductive material.

As described above, when the uppermost layer of the data line 171 includes a transparent conductive material, damage to the data line 171 can be prevented in the manufacturing process of the thin film transistor panel according to an exemplary embodiment. This will be described in detail later.

The light blocking layer 177 prevents light from reaching an oxide semiconductor layer 154, which will be described later, to prevent deterioration of channel characteristics of the thin film transistor such as through a leakage current. For this, the light blocking layer 177 according to an exemplary embodiment may overlap with a thin film transistor Q.

The light blocking layer 177 is disposed at the same layer as the data line 171, and may include the same material as the data line 171. In a manufacturing process, the data line 171 and the light blocking layer 177 may be formed together.

However, the light blocking layer 177 may include a different material from the data line 171, may be made of any material that does not transmit light, and may be made of any material such as an organic insulating material, an inorganic insulating material, or the like.

A portion of the light blocking layer 177 extends in the second direction, and may overlap with a longitudinal stem 193 of a pixel electrode 191.

A data insulating layer 160 is disposed on the line 171 and the light blocking layer 177. The data insulating layer 160 may be made of an organic insulating material or an inorganic insulating material.

The oxide semiconductor layer 154, a source electrode 173, and a drain electrode 175 are disposed on the data insulating layer 160. The oxide semiconductor layer 154, the source electrode 173, and the drain electrode 175 may overlap the light blocking layer 177 with the data insulating layer 160 therebetween.

The oxide semiconductor layer 154 may have a single layer or multiple layers including an oxide semiconductor material. The oxide semiconductor material is a metal oxide semiconductor. The oxide semiconductor may include an oxide of a metal such as zinc (Zn), indium (In), gallium (Ga), tin (Sn), and titanium (Ti), or some combination thereof. For example, the oxide semiconductor material may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO).

The source electrode and the drain electrode are respectively disposed at opposite sides, centering the oxide semiconductor layer, and are connected to the oxide semiconductor layer.

The source electrode 173 and drain electrode 175 may include the same material as the oxide semiconductor layer 154 and a reduced semiconductor material. That is, a portion of the oxide semiconductor layer 154 may be reduced to form the source electrode 173 and the drain electrode 175, respectively.

A gate insulating layer 140 is disposed on the oxide semiconductor layer 154, the source electrode 173, and the drain electrode 175. The gate insulating layer 140 may be made of a silicon nitride ($SiN_x$) (e.g., $Si_3N_4$) or a silicon oxide ($SiO_x$) such as silicon dioxide ($SiO_2$). The gate insulating layer 140 includes a first contact hole 184a overlapping a portion of the data line 171, a second contact hole 185a overlapping a portion of the source electrode 173, and a third contact hole 186a overlapping a portion of the drain electrode 175.

A gate conductor including a gate line 121 and a gate electrode 124 is disposed on the gate insulating layer 140. The gate conductor may be made of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), and titanium (Ti). Alternatively, the gate conductor may be made of other various kinds of metals or conductors. The gate conductor may have a multilayer structure.

The gate line 121 is extended in the first direction to cross the data line 171. A portion of the gate line 121 is expanded in a second direction perpendicular to the first direction to be the gate electrode 124. The gate electrode 124 overlaps the oxide semiconductor layer 154 and the light blocking layer 177.

The gate electrode 124, the source electrode 173, and the drain electrode 175 together with the oxide semiconductor layer 154 form a thin film transistor (TFT) Q, and a channel of the thin film transistor is disposed in the oxide semiconductor layer 154.

A color filter 230 may be disposed on the gate insulating layer 140. The color filter 230 may uniquely display one of primary colors, examples of which may include three primary colors such as red, green, and blue, or yellow, cyan, magenta, and the like.

The color filter 230 may include a red color filter, a green color filter, and a blue color filter repeatedly formed in the first direction or the second direction. Each of the red color filter, the green color filter, and the blue color filter constitutes one unit pixel, and one unit pixel displays a predetermined color image through light emitted through the color filter. According to an exemplary embodiment, the color filter 230 may be omitted.

The color filter 230 may not overlap the first contact hole 184a, the second contact hole 185a and the third contact hole 186a of the gate insulating layer 140.

An organic layer 180 is disposed on the color filter 230, the gate insulating layer 140, and the gate conductor. The organic layer 180 may flatten a step of the thin film transistor array panel.

Similar to the gate insulating layer 140, the organic layer 180 has a fourth contact hole 184b overlapping a portion of the data line 171, a fifth contact hole 185b overlapping a portion of the source electrode 173, and a sixth contact hole 186b overlapping a portion of the drain electrode 175.

As illustrated, the first contact hole 184a and the fourth contact hole 184b are aligned, the second contact hole 185a and the fifth contact hole 185b are aligned, and the third contact hole 186a and the sixth contact hole 186b are aligned, but they are not limited thereto, and all embodiments in which the fourth to sixth contact holes 184b, 185b, and 186b overlap with portions of the first to third contact holes 184a, 185a, and 186a are also possible.

The pixel electrode 191 and a connection electrode 197 are disposed on the organic layer 180. The pixel electrode 191 and the connection electrode 197 may include a transparent conductive material such as indium tin oxide or indium zinc oxide, or a reflective metal such as aluminum, silver, or an alloy thereof.

The pixel electrode 191 is physically and electrically connected to the drain electrode 175 through the third contact hole 186a and the sixth contact hole 186b.

The pixel electrode 191 includes a cross-shaped stem having a transverse stem 192 crossing a longitudinal stem 193. The pixel electrode 191 is divided into four sub-regions by the transverse stem 192 and the longitudinal stem 193, and each of the sub-regions includes a plurality of fine branch portions 194. In an exemplary embodiment, a longitudinal outer stem 195 disposed at both ends of the transverse stem 192 in parallel with the longitudinal stem 193 of the pixel electrode 191 may be further included. In addition, although not shown in the drawing, a transverse outer stem disposed at both ends of the longitudinal stem 193 in parallel with the longitudinal transverse stem 192 may be further included.

The fine branch portion 194 of the pixel electrode 191 forms an angle of about 40 to 45 degrees with the gate line 121 or the transverse stem 192. The fine branch portions 194 of the two neighboring regions may be orthogonal to each other. The width of the fine branch portions 194 may be gradually widened or spacing between branches of the fine branch portions 194 may be different.

However, the description of the pixel electrode 191 is only an example, and the pixel electrode design can be modified according to the embodiment.

The connection electrode 197 is an island type that is separated from the pixel electrode 191, and overlaps the data line 171 and the source electrode 173. The connection electrode 197 is physically and electrically connected to the data line 171 through the first contact hole 184a and the fourth contact hole 184b. Further, the connection electrode 197 is physically and electrically connected to the source electrode 173 through the second contact hole 185a and the fifth contact hole 185b.

Accordingly, the connection electrode 197 connects the data line 171 and the source electrode 173 to each other, such that the data signal applied from the data line 171 is transmitted to the source electrode 173.

A light blocking member 220 may be disposed on the pixel electrode 191 and the connection electrode 197. The light blocking member 220 may extend in the first direction parallel to the gate line 121, thereby overlapping the first to third contact holes 184a, 185a, and 186a and the fourth to sixth contact holes 184b, 185b, and 186b. Further, a portion of the light blocking member 220 may protrude in a direction perpendicular to a surface of the substrate, thereby forming a spacer 250. The spacer 250 maintains a gap between the thin film transistor array panel and the upper panel when a display device is manufactured using the thin film transistor array panel.

As described above, in the thin film transistor array panel according to the an exemplary embodiment, the data line 171 is disposed closest to the substrate 110 with respect to the surface of the substrate 110, the oxide semiconductor layer 154 is disposed on the data insulating layer 160 covering the data line 171, and the gate electrode 124 is disposed on the oxide semiconductor layer 154.

Further, the first contact hole 184a and the fourth contact hole 184b, the second contact hole 185a and the fifth contact hole 185b, and the third contact hole 186a and the sixth contact hole 186b of the thin film transistor array panel according to an exemplary embodiment are arranged side by side in the first direction. In other words, the first contact hole 184a and the fourth contact hole 184b, the second contact hole 185a and the fifth contact hole 185b, and the third contact hole 186a and the sixth contact hole 186b of the thin film transistor array panel are arranged in a straight line (i.e., in a row) along the first direction. Thus, the area where the pixel electrode 191 is located can be widened as compared with the array panel structure in which the contact holes are arranged in parallel in the second direction. Put another way, no contact hole is formed adjacent to another contact hole in the second direction, thereby increasing the aperture ratio of the display device.

Hereinafter, referring to FIG. 3 to FIG. 12, the manufacturing method for the thin film transistor array panel according to an exemplary embodiment will be described. FIG. 3, FIG. 4, FIG. 5, FIG. 6, FIG. 7, FIG. 8, FIG. 9, FIG. 10, FIG. 11, and FIG. 12 are cross-sectional views showing a manufacturing method of a thin film transistor array panel according to an exemplary embodiment.

Figure 3:
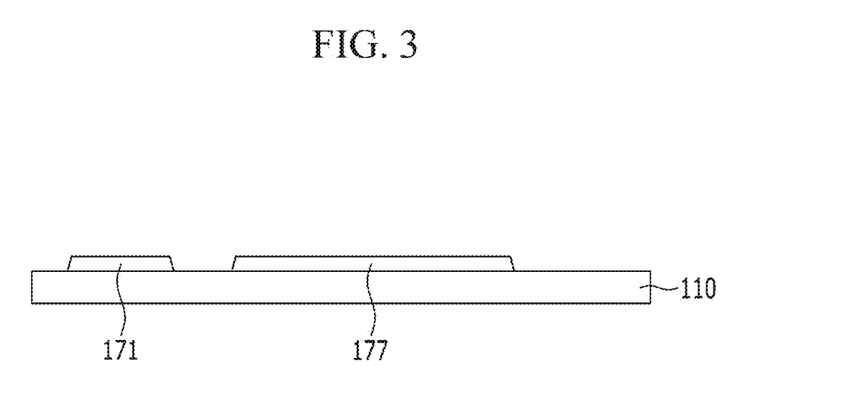
FIG. 3, FIG. 4, FIG. 5, FIG. 6, FIG. 7, FIG. 8, FIG. 9, FIG. 10, FIG. 11, and FIG. 12 are cross-sectional views showing a manufacturing method of a thin film transistor array panel according to an exemplary embodiment.

First, the data metal layer is deposited on the substrate and a photosensitive material is stacked thereon, and then a photolithography process using a first mask is applied to the data metal layer to form the data line 171 and the light blocking layer 177 on the substrate 110, as shown in FIG. 3. The data line 171 may be formed as a multilayer structure, and the uppermost layer of the data line in contact with the insulating layer may include a transparent conductive material. The light blocking layer 177 may be simultaneously formed with the data line 171, and may include the same material as the data line 171. However, the light blocking layer 177 may be formed with any material such as an organic insulating material, an inorganic insulating material, or the like, which is different from the data line 171.

In an exemplary embodiment, the data line 171 may have a triple layer structure of titanium/copper/indium tin oxide or titanium/copper/indium zinc oxide.

Figure 4:
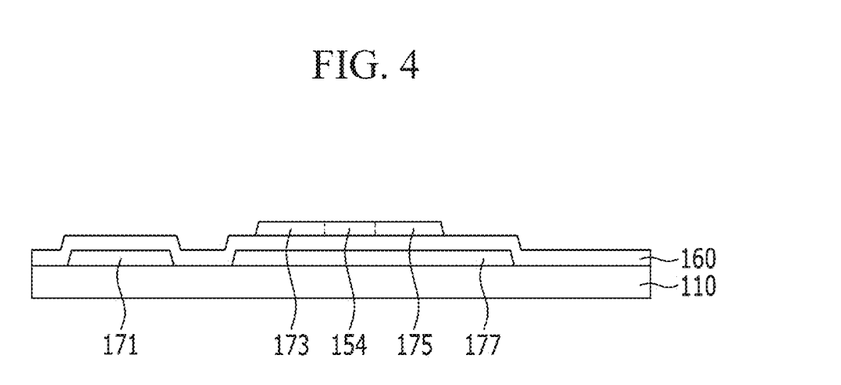

Referring to FIG. 4, the data insulating layer 160 is stacked on the data conductor and the light blocking layer 177, and then the oxide semiconductor layer 154, and the source electrode 173 and the drain electrode 175 which are connected to the oxide semiconductor layer 154, are formed on the light blocking layer 177 with the data insulating layer 160 interposed therebetween. The oxide semiconductor layer 154, the source electrode 173, and the drain electrode 175 may be formed by depositing an oxide semiconductor material on the substrate 110, stacking a photosensitive material thereon, and then applying a photolithography process using a second mask. The source electrode 173 and drain electrode 175 may include the same material as the oxide semiconductor layer 154, and may include a material of which the material constituting the oxide semiconductor layer 154 is reduced.

Figure 5:
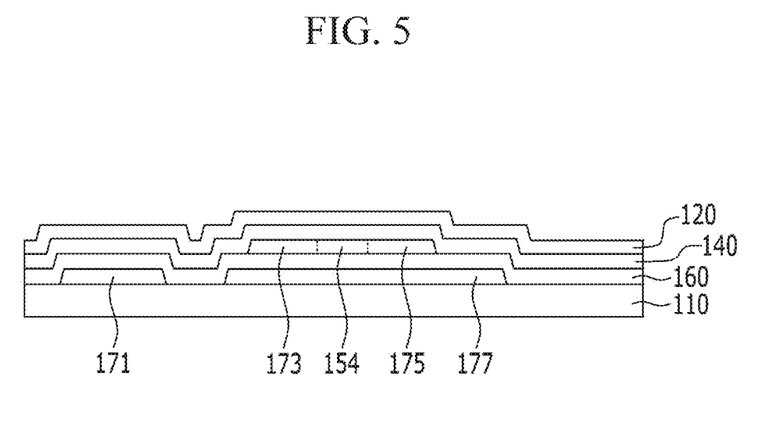

Next, referring to FIG. 5, the gate insulating layer 140 and a gate metal layer 120 (or metallic material layer) are formed on the oxide semiconductor layer 154, the source electrode 173, and the drain electrode 175.

Figure 6:
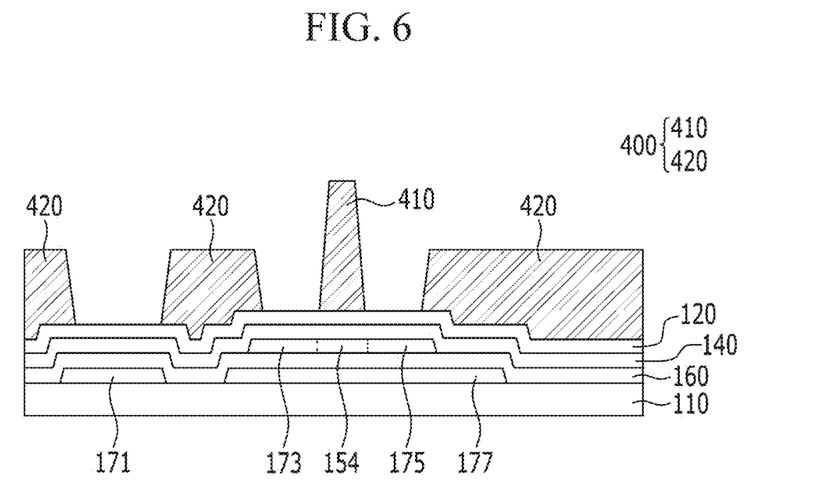

Referring to FIG. 6, a first photoresist pattern 400 having different heights depending on the position is then formed on the gate metal layer 120. The first photoresist pattern 400 is not formed in the region where the contact holes are to be formed later, a first portion 410 thereof having a first height is formed in the region where the gate electrode is to be formed later, and a second portion 420 thereof having a second height lower than the height is formed in the other region. As described above, there are various methods for forming the photoresist film to have different thicknesses depending on the position. For example, an exposure mask can be formed to include a semi-transparent area as well as a transparent area and a light blocking area. In the semi-transparent region, a slit pattern, a lattice pattern, or a thin film having intermediate transmittance or an intermediate thickness is provided. When the slit pattern is used, it is preferable that the width of the slit or an interval between the slits is smaller than the resolution of the exposure apparatus used in the photolithography process. Another example is to use a photoresist film capable of reflowing. That is, the thinner portion is formed by forming a reflowable photoresist pattern with a conventional mask having only a transparent region and a light blocking region, and then reflowing the photoresist to a region where the photoresist is not left.

Figure 7:
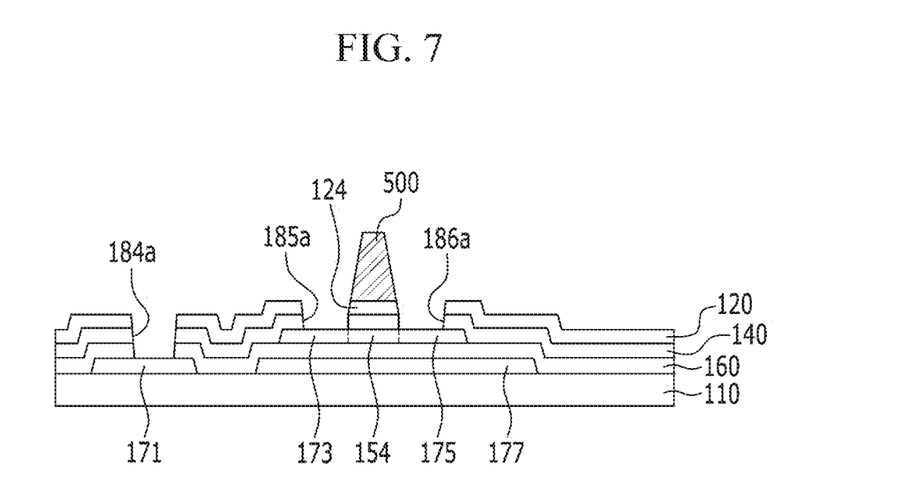

Next, referring to FIG. 7, the gate metal layer 120 and the gate insulating layer 140 are etched by using the first photoresist pattern 400 as a mask, and then a second photoresist pattern 500 is formed by lowering the height of the first photoresist pattern 400. In this case, the regions where the gate metal layer 120 and the gate insulating layer 140 are etched and removed become the first contact hole 184a, the second contact hole 185a, and the third contact hole 186a.

The gate metal layer 120 and the gate insulating layer 140 may be etched by first wet etching the gate metal layer 120 and then dry etching the gate insulating layer 140. Dry etching can cause damage to organic materials in the etching process due to etching with high energy, but there is no risk of damage here since the organic material is not formed before this step.

The process of forming the second photoresist pattern 500 by lowering the height of the first photoresist pattern 400 may be performed by an ashing method. The second portion 420 in FIG. 6 is completely removed, leaving only a portion of the first portion 410 to form a second photoresist pattern 500 as shown in FIG. 7. Due to the height difference between the first portion 410 and the second portion 420, a portion of the first portion 410 remains to be the second photoresist pattern 500 while the second portion 420 is completely removed.

Figure 8:
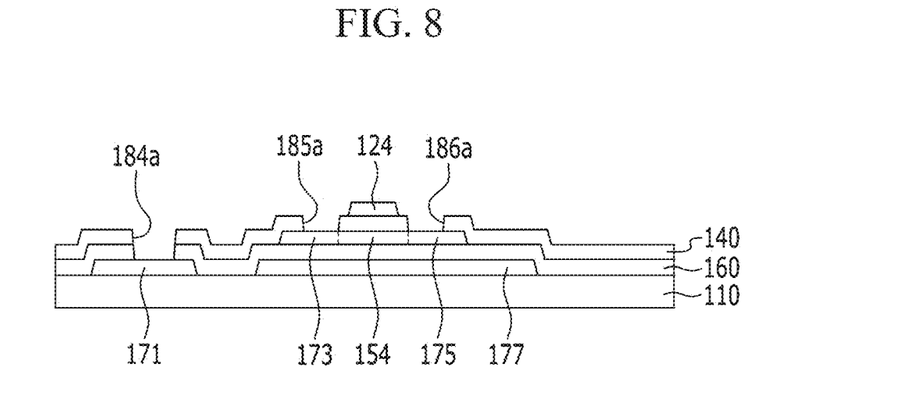

Next, referring to FIG. 8, the gate line 121 and the gate electrode 124 are formed by removing the gate metal layer 120 by using the second photoresist pattern 500 as a mask, and then the second photoresist pattern 500 is removed.

Figure 9:
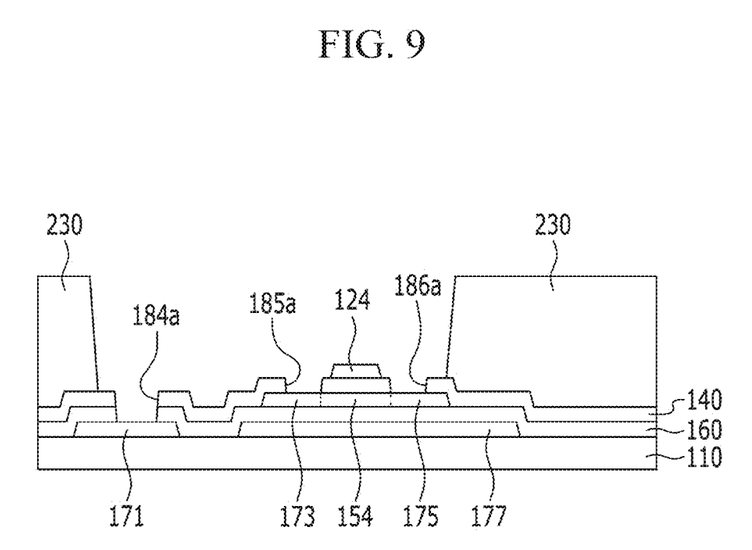

As shown in FIG. 9, a color filter material is then applied and patterned to form the color filter 230. The color filter 230 may be patterned so as to not overlap the first contact hole 184a, the second contact hole 185a, and the third contact hole 186a described above. However, according to an exemplary embodiment, the forming process of the color filter 230 may be omitted.

Figure 10:
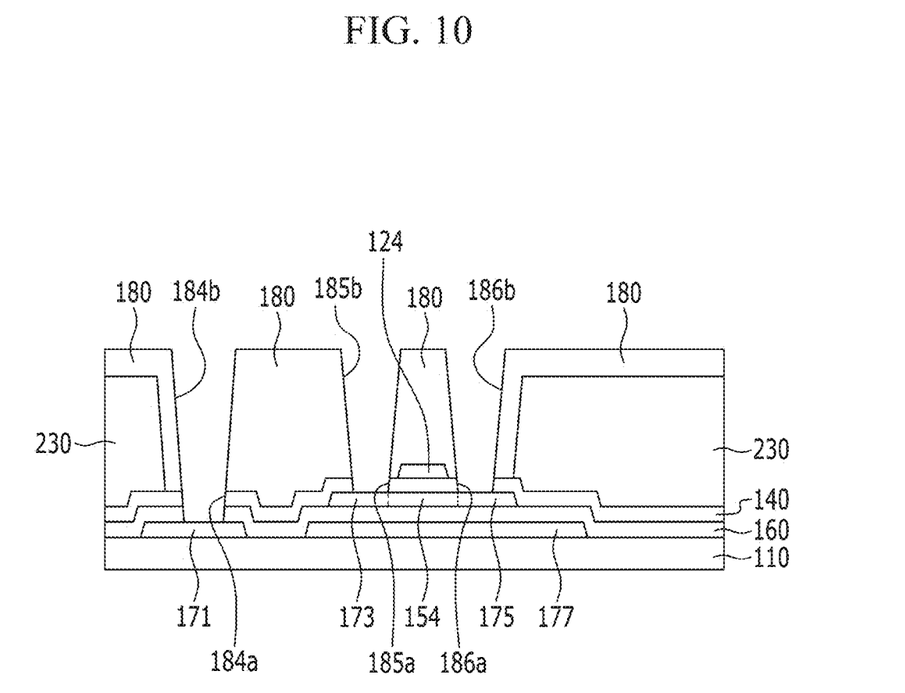

Subsequently, as shown in FIG. 10, the organic layer 180 is applied and patterned to form the fourth, fifth, and sixth contact holes 184b, 185b, and 186b respectively overlapping the first, second, and third contact holes 184a, 185a, and 186a. That is, the fourth contact hole 184b overlapping the first contact hole 184a, the fifth contact hole 185b overlapping the second contact hole 185a, and the sixth contact hole 186b overlapping the third contact hole 186a are formed in the organic layer 180.

Figure 11:
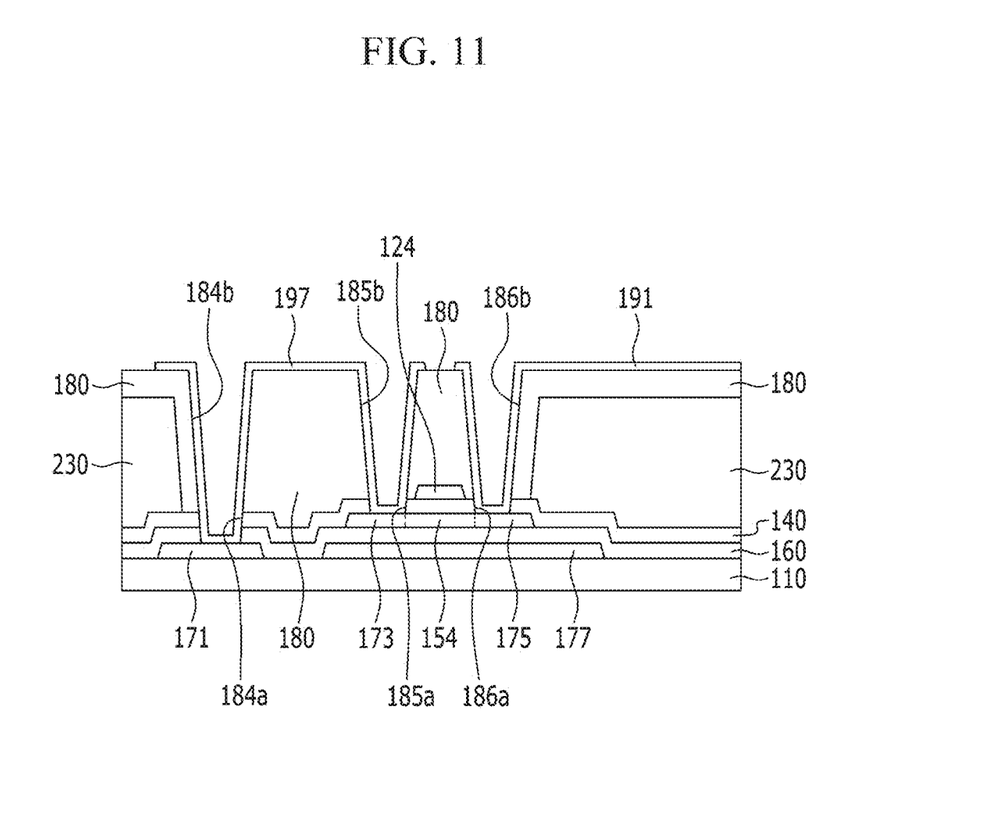

Referring to FIG. 11, an electrode material is then deposited on the organic layer 180, a photosensitive material is stacked thereon, and a photolithography process using a third mask is applied to the electrode material to form the connection electrode 197 and the pixel electrode 191.

The connection electrode 197 contacts the data line 171 through the first contact hole 184a and the fourth contact hole 184b, and contacts the source electrode 173 through the second contact hole 185a and the fifth contact hole 185b. Further, the pixel electrode 191 contacts the drain electrode 175 through the third contact hole 186a and the sixth contact hole 186b.

Figure 12:
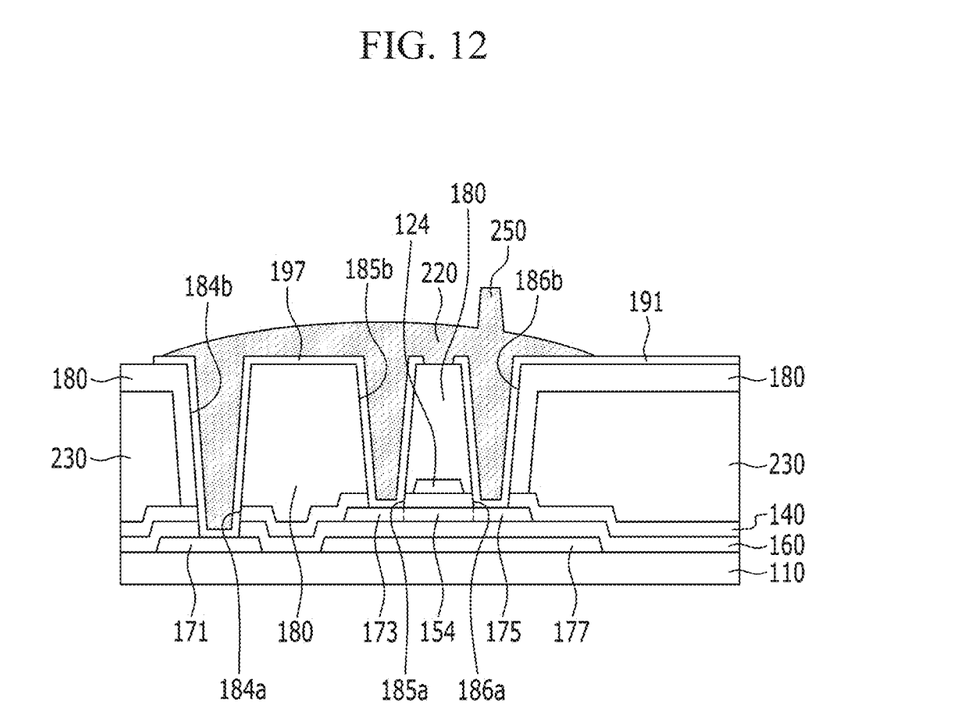

Next, referring to FIG. 12, the light blocking member 220 is formed on the organic layer 180, the connection electrode 197, and the pixel electrode 191. The light blocking member 220 may overlap the first to sixth contact holes 184a, 185a, 186a, 184b, 185b, and 186b, a portion of the light blocking member 220 may have a protrusion protruded in a direction perpendicular to a surface of the substrate, and the protrusion forms the spacer 250. The spacer 250 maintains a gap between the thin film transistor array panel and the upper panel when a display device is manufactured using the thin film transistor array panel.

As described above, in the manufacturing method of the thin film transistor array panel according to an exemplary embodiment, the gate electrode and the contact holes of the gate insulating layer are simultaneously formed. Accordingly, it is possible to reduce the number of masks used in the process.

In the conventional process, one mask is used to form the gate electrode, and another mask is used in the process of etching the organic layer and the gate insulating layer to form contact holes. However, in the manufacturing method according to an exemplary embodiment, the gate electrode and the contact holes of the gate insulating layer can be formed by using one mask.

Figure 13:
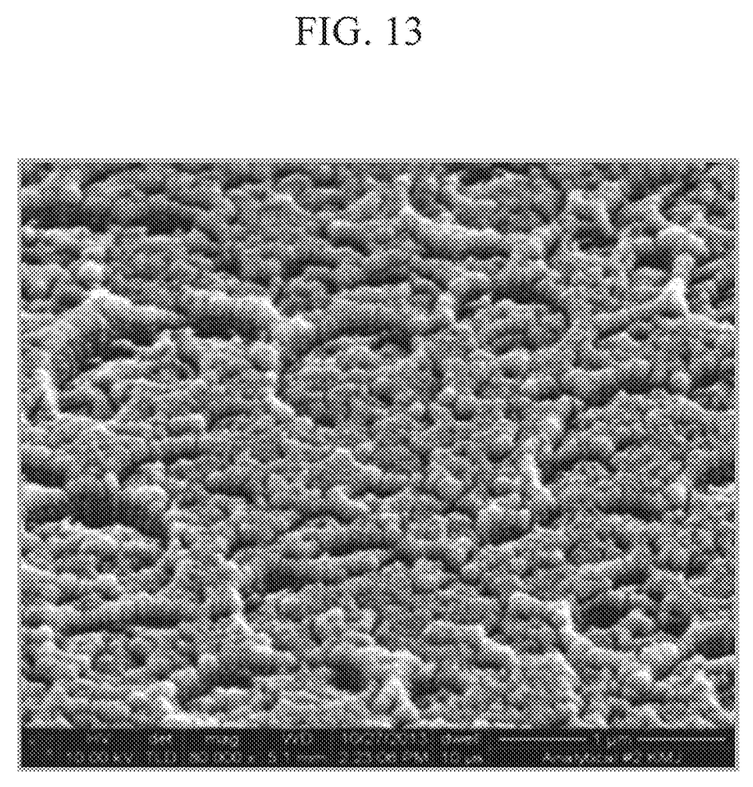
FIG. 13 shows a surface of a damaged organic layer.
Figure 14:
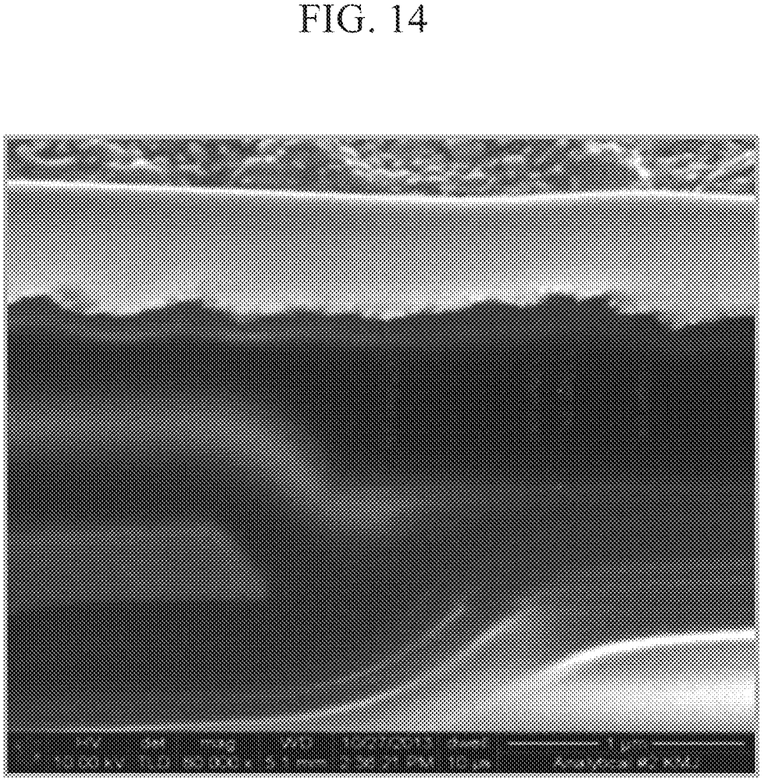
FIG. 14 shows a cross-section of a damaged organic layer.

Further, in the conventional process, the organic layer and the gate insulating layer were simultaneously etched to form contact holes. In this case, since the gate insulating film is hard, it is dry-etched. In this process, the surface of the soft organic layer is damaged. FIG. 13 and FIG. 14 show a surface of a damaged organic layer. FIG. 13 is a planar image of an organic layer, and it can be confirmed that the surface of the organic layer is rough. FIG. 14 is a side image of the damaged organic layer, and it can be confirmed that the organic layer is not flat but is rugged. As described above, the organic layer damaged during the dry etching of the gate insulating film deteriorates the transmittance and the quality of the display device.

However, in the manufacturing method according to an exemplary embodiment, since the gate insulating layer is etched first and then the organic layer is formed, the organic layer is not damaged during the etching of the gate insulating layer. Thus, a display device with improved transmittance and display quality can be manufactured.

As described above, the thin film transistor array panel according to an exemplary embodiment has the data line 171 disposed closest to the substrate 110, and has a top gate structure in which the gate electrode 124 is disposed on the oxide semiconductor layer 154. In the thin film transistor array panel according to an exemplary embodiment, since the first contact hole 184a and the fourth contact hole 184b, the second contact hole 185a and the fifth contact hole 185b, and the third contact hole 186a and the sixth contact hole 186b are arranged side by side in a first direction, the area of the thin film transistor can be minimized, and thus the aperture ratio can be improved.

Further, in the manufacturing method of the thin film transistor array panel according to an exemplary embodiment, since the gate line and the opening of the gate insulating layer are simultaneously formed by using one mask, the number of masks used in the manufacturing process can be reduced. In addition, since the organic layer is formed after the opening is formed in the gate insulating layer, the problem that the organic layer is damaged in the dry etching process for forming the opening of the gate insulating layer can be solved.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A thin film transistor array panel, comprising:
   a substrate;
   a data line and a light blocking layer disposed on the substrate;
   a thin film transistor disposed on the light blocking layer and comprising a source electrode, a drain electrode, and an oxide semiconductor layer; and
   an insulating layer disposed on the substrate and comprising a first contact hole overlapping a portion of the data line, a second contact hole overlapping a portion of the source electrode, and a third contact hole overlapping a portion of the drain electrode,
   a pixel electrode contacting the drain electrode through the third contact hole,
   a color filter disposed between the substrate and the pixel electrode,
   wherein the first contact hole, the second contact hole, and the third contact hole are arranged in a row in a first direction perpendicular to a direction in which the data line is extended, and
   wherein the color filter does not overlap the first contact hole, the second contact hole, and the third contact hole.

2. The thin film transistor array panel of claim 1, wherein the source electrode and the drain electrode are disposed as the same layer as the oxide semiconductor layer, and
the source electrode and the drain electrode are respectively connected to the oxide semiconductor layer at opposite sides with the oxide semiconductor layer disposed between the source and drain electrodes.

3. The thin film transistor array panel of claim 1, wherein the source electrode and the drain electrode comprise a material reduced from the oxide semiconductor layer.

4. The thin film transistor array panel of claim 1, further comprising a gate line extending in the first direction,
wherein the gate line comprises a gate electrode extending in a second direction perpendicular to the first direction.

5. The thin film transistor array panel of claim 4, wherein the gate electrode overlaps the oxide semiconductor layer.

6. The thin film transistor array panel of claim 1, further comprising a connection electrode contacting the data line through the first contact hole and contacting the source electrode through the second contact hole.

7. The thin film transistor array panel of claim 1, wherein the data line comprises multiple layers, and an uppermost layer of the data line, in contact with the insulating layer, is a transparent conductive material.

8. A thin film transistor array panel, comprising:
a substrate;
a data line and a light blocking layer disposed on the substrate;
a thin film transistor disposed on the light blocking layer and comprising a source electrode, a drain electrode, and an oxide semiconductor layer; and
an insulating layer disposed on the substrate and comprising a first contact hole overlapping a portion of the data line, a second contact hole overlapping a portion of the source electrode, and a third contact hole overlapping a portion of the drain electrode,
a pixel electrode contacting the drain electrode through the third contact hole,
a connection electrode contacting the data line through the first contact hole and contacting the source electrode through the second contact hole, and
a light blocking member disposed on the pixel electrode and the connection electrode,
wherein the first contact hole, the second contact hole, and the third contact hole are arranged in a row in a first direction perpendicular to a direction in which the data line is extended, and
wherein a portion of the light blocking member protrudes in a direction perpendicular to a surface of the substrate.

9. A method for manufacturing a thin film transistor array panel, comprising:
forming a data line on a substrate;
forming a source electrode, a drain electrode, and an oxide semiconductor layer on the substrate;
applying an insulating layer and a metallic material layer on the source electrode, the drain electrode, and the oxide semiconductor layer;
forming a first photoresist pattern on the metallic material layer, the first photoresist pattern comprising a first portion having a first height and a second portion having a second height lower than the first height;
etching the insulating layer and the metallic material layer by using the first photoresist pattern to form a first contact hole overlapping a portion of the data line, a second contact hole overlapping a portion of the source electrode, and a third contact hole overlapping a portion of the drain electrode in the insulating layer;
removing the first portion of the first photoresist pattern and part of the second portion of the first photoresist pattern to form a second photoresist pattern; and
etching the metallic material layer by using the second photoresist pattern as an etching mask.

10. The method of claim 9, further comprising forming a light blocking layer on the substrate simultaneously with the data line,
wherein the light blocking layer is disposed under the source electrode, the drain electrode, and the oxide semiconductor layer.

11. The method of claim 9, further comprising forming a gate line and a gate electrode from etching the metallic material layer,
wherein the gate line extends in a first direction, and
wherein the gate electrode extends in a second direction perpendicular to the first direction and extends from the gate line.

12. The method of claim 9, wherein the first contact hole, the second contact hole, and the third contact hole, are dry etched.

13. The method of claim 9, further comprising:
depositing an organic layer after etching the metallic material layer; and
patterning the organic layer to form contact holes in the organic layer, the contact holes respectively overlapping the first contact hole, the second contact hole, and the third contact hole of the insulating layer.

14. The method of claim 9, further comprising:
forming a connection electrode contacting the data line through the first contact hole and contacting the source electrode through the second contact hole; and
forming a pixel electrode contacting the data line through the first contact hole and contacting the source electrode through the second contact hole.

15. The method of claim 9, wherein:
the source electrode and the drain electrode are disposed as the same layer as the oxide semiconductor layer and are connected to the oxide semiconductor layer at opposite sides with the oxide semiconductor layer disposed between the source and drain electrodes, and
the source electrode and the drain electrode comprise a reduced material from the oxide semiconductor layer.

16. The method of claim 9, further comprising forming a light blocking member overlapping the first contact hole, the second contact hole, and the third contact hole,
wherein a portion of the light blocking member protrudes in a direction perpendicular to a surface of the substrate.

17. The method of claim 9, wherein the first contact hole, the second contact hole, and the third contact hole are formed in a row arrangement along a first direction perpendicular to a direction in which the data line is extended.

18. The method of claim 9, wherein the data line comprises multiple layers and an uppermost layer of the data line, in contact with the insulating layer, is formed with a transparent conductive material.

* * * * *